(12) United States Patent
Matsunaga et al.

(10) Patent No.: US 10,165,704 B2
(45) Date of Patent: Dec. 25, 2018

(54) EXTERNAL POWER FEEDING APPARATUS

(71) Applicant: HONDA MOTOR CO., LTD., Tokyo (JP)

(72) Inventors: Shohei Matsunaga, Wako (JP); Masanori Shin, Wako (JP); Yuki Wada, Wako (JP); Takayuki Komatsu, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 15/408,577

(22) Filed: Jan. 18, 2017

(65) Prior Publication Data
US 2017/0238439 A1     Aug. 17, 2017

(30) Foreign Application Priority Data
Feb. 12, 2016   (JP) .................................. 2016-024653

(51) Int. Cl.
| | | |
|---|---|---|
| *H05K 7/18* | (2006.01) | |
| *B60K 1/04* | (2006.01) | |
| *B60L 11/18* | (2006.01) | |
| *H02M 7/00* | (2006.01) | |

(52) U.S. Cl.
CPC ................ *H05K 7/18* (2013.01); *B60L 11/18* (2013.01); *H02M 7/003* (2013.01)

(58) Field of Classification Search
CPC .............. H05K 7/18; B60K 2001/0477; B60K 2001/0416; B60K 2001/0405; B60K 2001/0455; B60K 2001/0494; B60K 1/04; B60R 16/04; B60S 5/06; B62D 25/08; B62D 25/087
See application file for complete search history.

(56) References Cited

U.S. PATENT DOCUMENTS

| | | | | |
|---|---|---|---|---|
| 1,677,789 A | * | 7/1928 | Mabey ..................... | B60R 16/04 180/68.5 |
| 1,815,488 A | * | 7/1931 | Willard .................... | B60R 16/04 180/68.5 |
| 4,327,809 A | * | 5/1982 | Fenstermaker ......... | B60R 16/04 180/68.5 |
| 4,506,748 A | * | 3/1985 | Thomas .............. | H01M 2/1083 180/68.5 |

(Continued)

FOREIGN PATENT DOCUMENTS

WO         2011/145408 A1     11/2011

*Primary Examiner* — Gregory A Blankenship
(74) *Attorney, Agent, or Firm* — Westerman, Hattori, Daniels & Adrian, LLP (57) ABSTRACT

An external power feeding apparatus is portable and mountable in a vehicle, incorporating a power supply unit, and capable of supplying power to outside. A pair of frameworks is arranged on both sides of the power supply unit to face each other at a predetermined interval and formed into a substantially rectangular frame shape. A first connecting member connects first sides of the pair of frameworks and is formed into a substantial U shape. A second connecting member connects second sides of the pair of frameworks, which are provided to intersect one end sides of the first sides and is formed into a substantial U shape. A third connecting member connects third sides of the pair of frameworks, which are provided to intersect other end sides of the first sides and is formed into a substantial U shape.

3 Claims, 9 Drawing Sheets

(56) References Cited

U.S. PATENT DOCUMENTS

| | | | | |
|---|---|---|---|---|
| 5,004,081 | A * | 4/1991 | Custer | B60R 16/04 180/68.5 |
| 5,222,711 | A * | 6/1993 | Bell | B60R 16/04 180/68.5 |
| 2009/0020350 | A1* | 1/2009 | Wu | B62K 5/025 180/208 |
| 2009/0121510 | A1* | 5/2009 | Kim | B60K 1/04 296/24.33 |
| 2010/0175940 | A1* | 7/2010 | Taneda | B60K 1/04 180/68.5 |
| 2012/0175177 | A1* | 7/2012 | Lee | B60K 1/04 180/68.5 |
| 2012/0328925 | A1* | 12/2012 | Choo | H01M 2/1077 429/99 |
| 2013/0015683 | A1 | 1/2013 | Minami | |
| 2013/0277130 | A1* | 10/2013 | Katou | B60K 1/04 180/68.5 |
| 2014/0076829 | A1* | 3/2014 | Fan | H05K 7/1488 211/26 |
| 2015/0249420 | A1* | 9/2015 | Vitrano | H02P 25/16 318/494 |
| 2015/0255764 | A1* | 9/2015 | Loo | H01M 2/1083 429/149 |
| 2017/0198858 | A1* | 7/2017 | Bruchal | F16M 11/42 |
| 2017/0238439 | A1* | 8/2017 | Matsunaga | H05K 7/18 361/829 |

* cited by examiner

EXTERNAL POWER FEEDING APPARATUS

BACKGROUND OF THE INVENTION

Field of the Invention

The present invention relates to an external power feeding apparatus configured to be portable and mountable on a vehicle and incorporating a power supply unit.

Description of the Related Art

As a protective frame structure for a power supply apparatus, there is known a structure that internally stores a power supply apparatus (to be referred to as an external power feeding apparatus hereinafter) mounted in a vehicle and includes a frame extending in the vehicle width direction and connected to the vehicle body. According to the protective frame structure, the external power feeding apparatus stored in the protective frame structure can be protected by transmitting an impact load input due to a collision or the like to the vehicle body via the frame of the protective frame structure (International Publication No. 2011/145408).

In addition, intrusion of the protective frame structure to the cabin side can be suppressed by transmitting the impact load input to the protective frame structure to the vehicle body via the frame and also suppressing deformation of the frame. To suppress deformation of the frame by the input impact load, the protective frame structure of International Publication No. 2011/145408 needs to increase the rigidity of the protective frame structure.

Hence, the weight of the protective frame structure increases, and there is yet room for improvement from the viewpoint of usability.

SUMMARY OF THE INVENTION

The present invention provides an external power feeding apparatus that has excellent usability and, when an impact load is input due to a collision or the like, suppresses intrusion to the cabin side caused by the impact load.

According to an aspect of the present invention, there is provided an external power feeding apparatus configured to be portable and mountable in a vehicle, incorporating a power supply unit, and capable of supplying power from the power supply unit to the outside. A pair of frameworks arranged on both sides of the power supply unit to face each other at a predetermined interval and formed into a substantially rectangular frame shape are provided. A first connecting member configured to connect first sides of the pair of frameworks and formed into a substantial U shape is provided. A second connecting member configured to connect second sides of the pair of frameworks, which are provided to intersect one end sides of the first sides and formed into a substantial U shape, is provided. A third connecting member configured to connect third sides of the pair of frameworks, which are provided to intersect other end sides of the first sides and formed into a substantial U shape, is provided.

Further features of the present invention will become apparent from the following description of exemplary embodiments (with reference to the attached drawings).

DESCRIPTION OF THE EMBODIMENTS

The best mode for carrying out the present invention will now be described with reference to the accompanying drawings.

Note that "front (Fr)", "rear (Rr)", "left (L)", and "right (R)" in the drawings are defined by the direction of an operator who tows a power conversion apparatus 20.

Note that in the embodiment, an external power feeding apparatus will be exemplified as the power conversion apparatus 20. However, the external power feeding apparatus is not limited to the power conversion apparatus 20.

The power conversion apparatus 20 according to the embodiment will be described.

Figure 1:
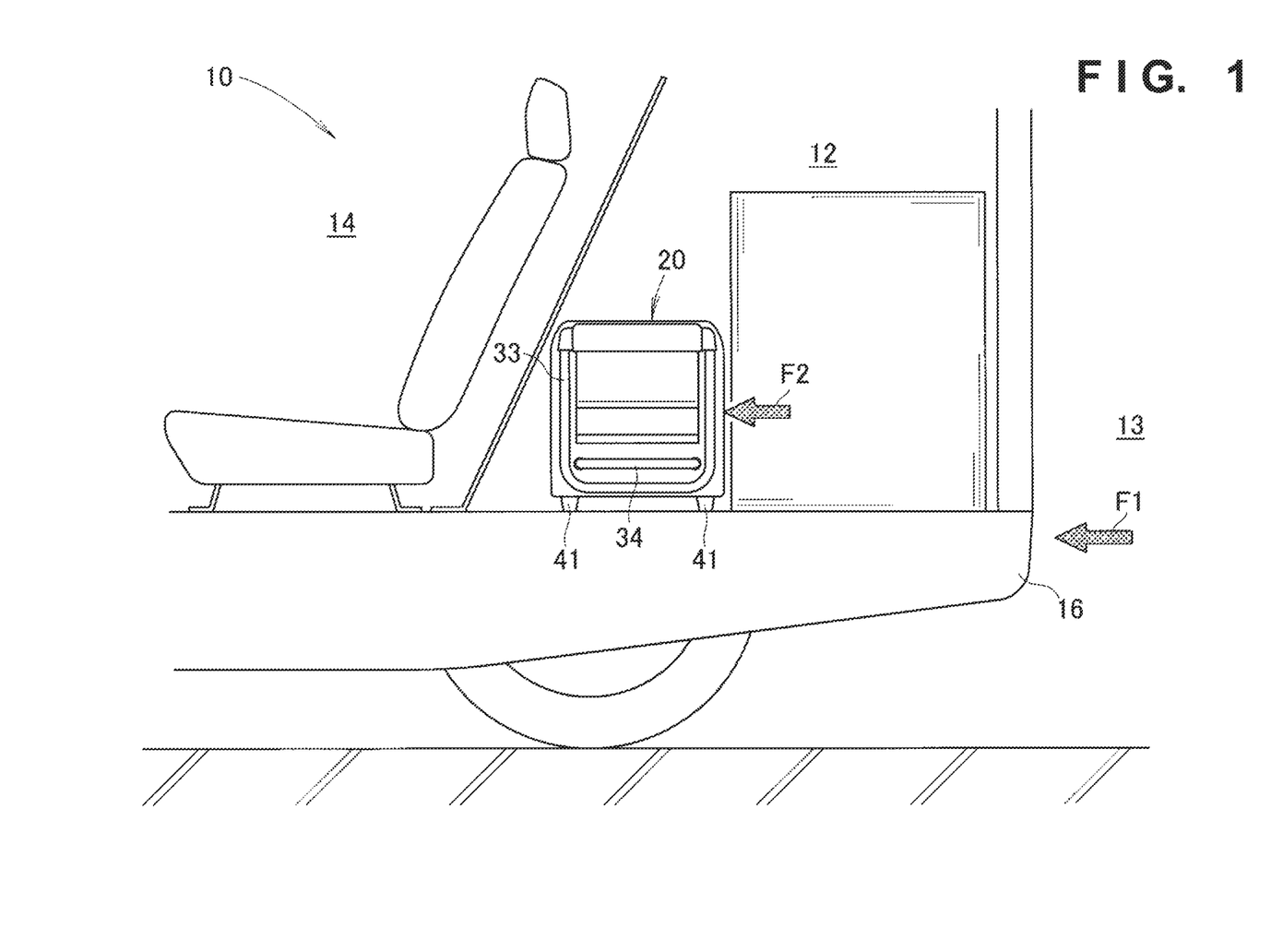
FIG. 1 is a side view showing a state in which a power conversion apparatus according to the present invention is mounted in the rear luggage room of a vehicle.

As shown in FIG. 1, the portable power conversion apparatus 20 is loaded in a rear luggage room 12 of a vehicle 10 and conveyed to a use place. The vehicle 10 is a vehicle that generates DC power, and examples are a fuel cell vehicle and a plug-in hybrid vehicle.

The operator conveys the power conversion apparatus 20 to the use place by the vehicle 10, and then unloads the power conversion apparatus 20 from the rear luggage room 12 of the vehicle 10 to an exterior 13, thereby using the power conversion apparatus 20.

If an impact load F1 is input to a rear portion 16 of the vehicle 10 due to a rear end collision or the like during traveling of the vehicle 10, an impact load F2 may be input to the power conversion apparatus 20. Hence, the power conversion apparatus 20 is configured to suppress intrusion of the power conversion apparatus 20 to the side of a cabin 14 caused by the impact load F2. The power conversion apparatus 20 will be explained in detail.

Figure 2:
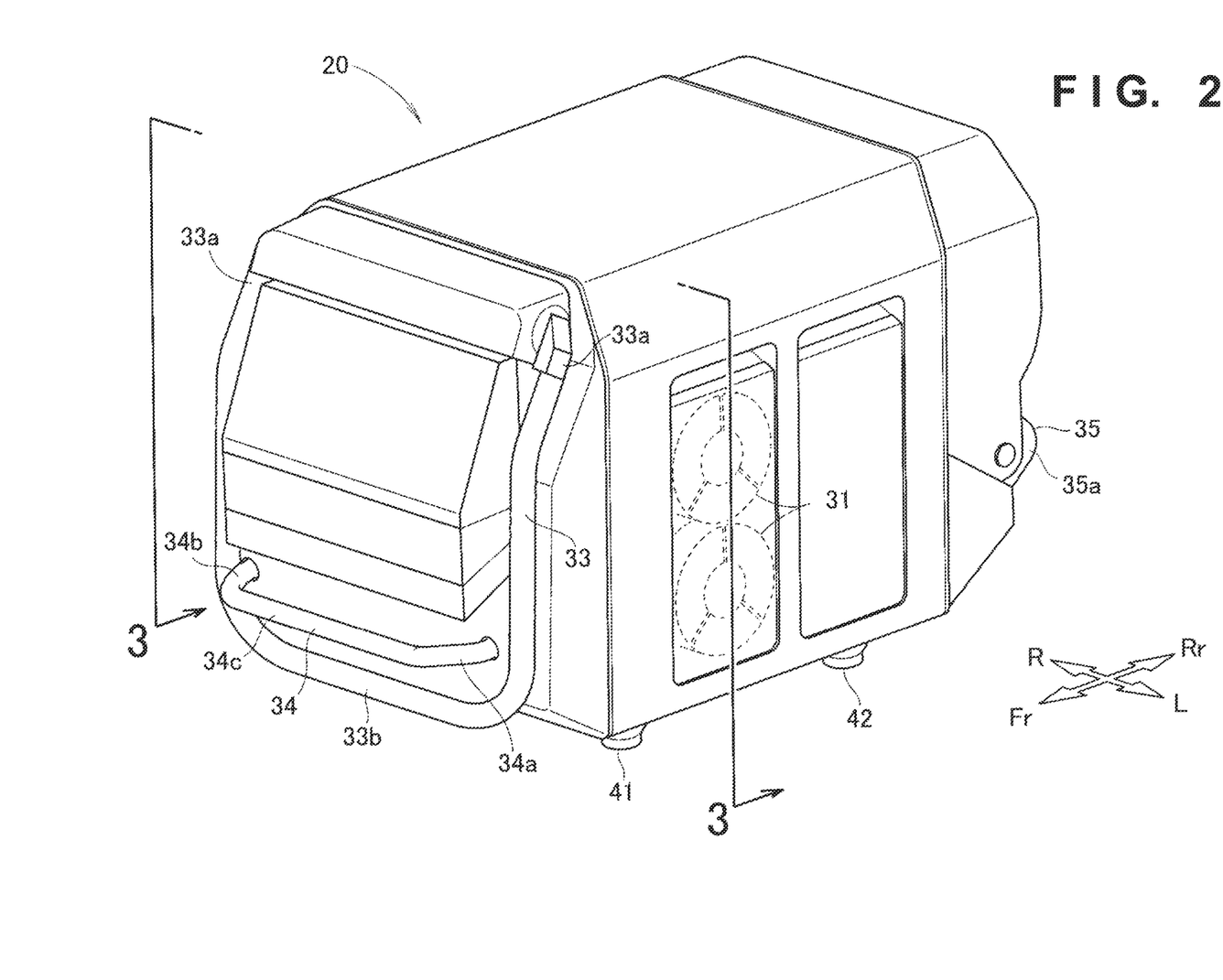
FIG. 2 is a perspective view showing the power conversion apparatus shown in FIG. 1.
Figure 3:
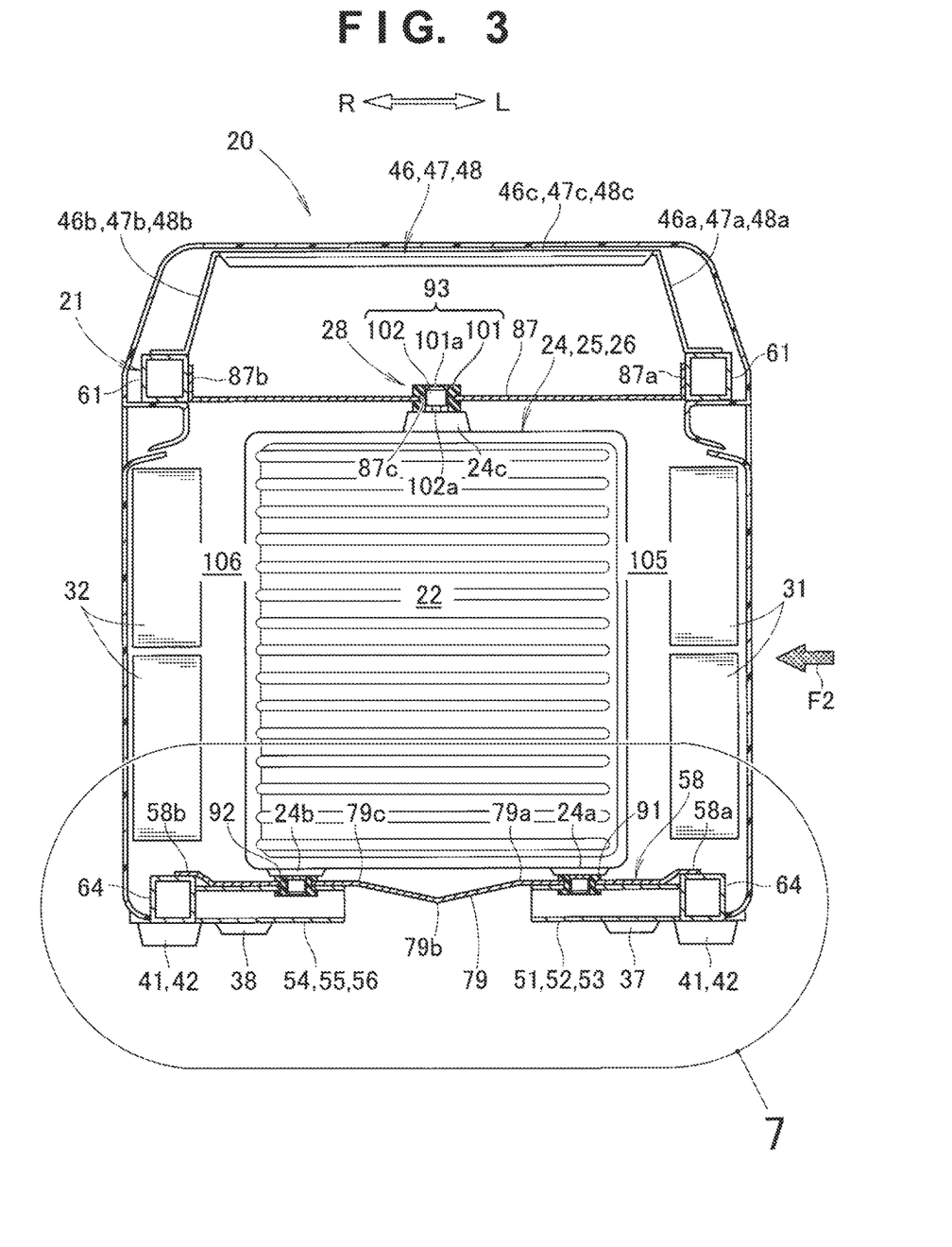
FIG. 3 is a sectional view taken along a line 3-3 in FIG. 2.

As shown in FIGS. 2 and 3, the power conversion apparatus 20 includes a housing 21 formed into an almost rectangular frame body, first to third power conversion units (power supply units) 24 to 26 (see FIG. 5 as well) provided in an interior 22 of the housing 21, support portions 28 that mount the first to third power conversion units 24 to 26 in the housing 21, a plurality of blowing fans 31 that supply outside air to the first to third power conversion units 24 to 26, and a plurality of intake fans 32 that discharge inside air (air) from the interior 22 of the housing 21 to the exterior 13.

In addition, the power conversion apparatus 20 includes a towing handle 33 connected to the upper front portion of the housing 21 to be swingable in the vertical direction, a carrying front grip (second connecting member) 34 provided on the front portion of the housing 21, a carrying rear grip (third connecting member) 35 provided on the rear portion of the housing 21, and a left wheel (wheel) 37 and a right wheel (wheel) 38 (see FIG. 4) which are provided on the lower rear portion of the housing 21.

The towing handle 33 is formed into an almost U shape. A pair of bases 33a are connected to the upper front portion of the housing 21 to be pivotal in the vertical direction. The length of a gripper 33b of the handle 33 is set to be smaller than the width of the power conversion apparatus 20.

The operator makes the towing handle 33 swing upward about the pair of bases 33a serving as pivots, holds the gripper 33b of the handle 33, and raises a front leg 41 and a rear leg 42 of the housing 21 by the gripper 33b. In this state, the left wheel 37 and the right wheel 38 are in contact with the ground.

In the state in which the left wheel 37 and the right wheel 38 are in contact with the ground, the operator can tow (move) the power conversion apparatus 20 frontward by the left wheel 37 and the right wheel 38 by pulling the gripper 33b.

In addition, the operator can carry the power conversion apparatus 20 by holding both the front grip 34 and the rear grip 35 and raising the power conversion apparatus 20. The operator can also place the power conversion apparatus 20 in the rear luggage room 12 (see FIG. 1) of the vehicle 10 by raising the power conversion apparatus 20.

Figure 4:
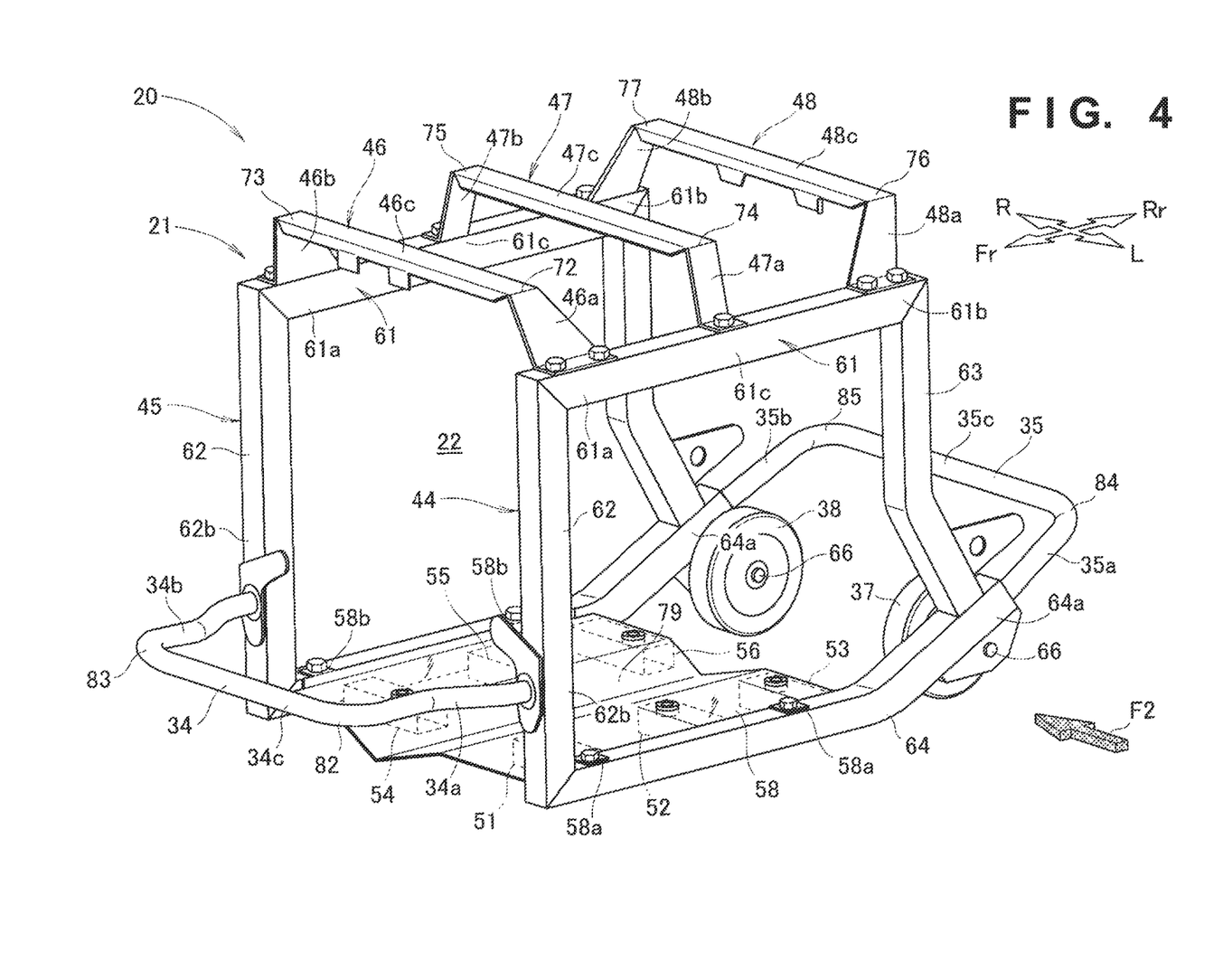
FIG. 4 is a perspective view showing the housing of the power conversion apparatus shown in FIG. 2.
Figure 5:
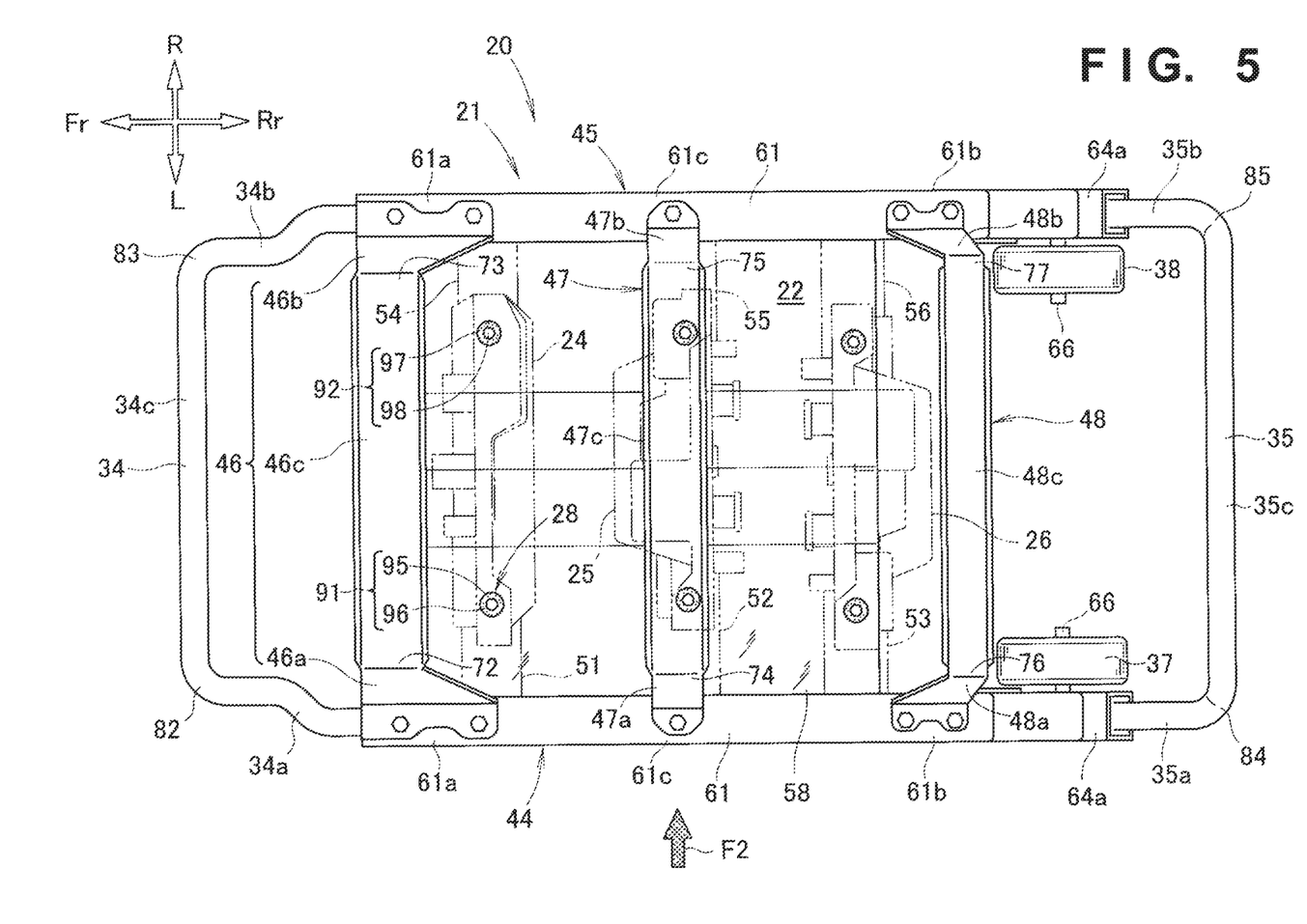
FIG. 5 is a plan view showing the housing of the power conversion apparatus shown in FIG. 4.

As shown in FIGS. 4 and 5, the housing 21 includes a pair of frameworks 44 and 45 arranged on both sides of the first to third power conversion units 24 to 26 to face each other at a predetermined interval, and first to third upper connecting members (first connecting members) 46 to 48 that connect the pair of frameworks 44 and 45. The housing 21 also includes first to third support frames 51 to 53 provided on one of the pair of frameworks 44 and 45, first to third support frames 54 to 56 provided on the other of the pair of frameworks 44 and 45, and a connecting panel 58 that connects the pair of frameworks 44 and 45.

For easy understanding of the structure, an explanation will be made below by defining one of the pair of frameworks 44 and 45 as the left framework 44 and the other as the right framework 45. Note that the left framework 44 and the right framework 45 are members of almost bilateral symmetry. The same reference numerals denote the same constituent members in the frameworks 44 and 45, and a detailed description of the right framework 45 will be omitted below.

Figure 6:
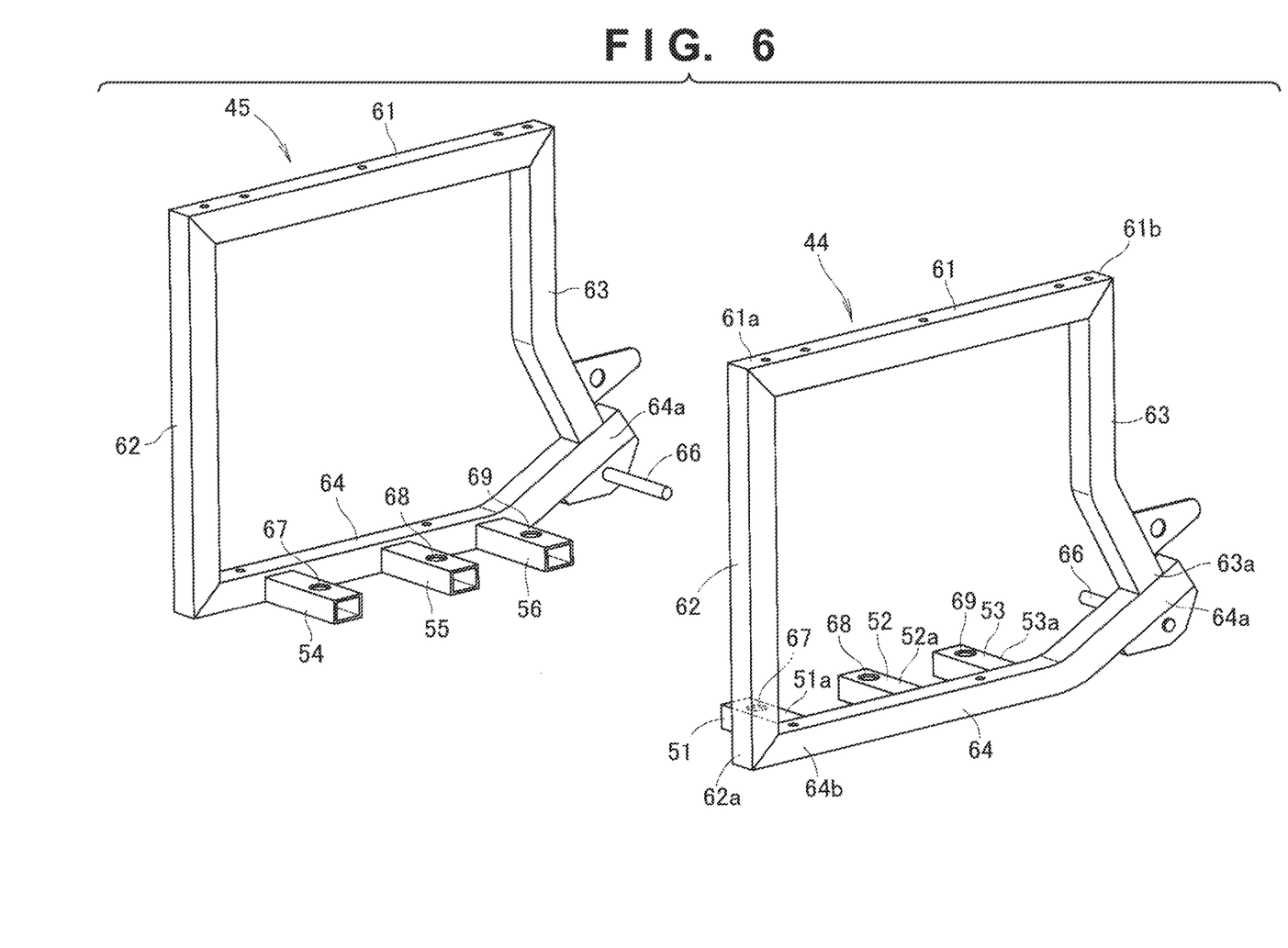
FIG. 6 is a perspective view showing the left and right frameworks of the housing shown in FIG. 4.

As shown in FIG. 6, the left framework 44 includes an upper frame (first side) 61 that forms the upper frame of the left framework 44, a front frame (second side) 62 that is provided at one end 61a of the upper frame 61 to form the front frame of the left framework 44, a rear frame (third side) 63 that is provided at the other end 61b of the upper frame 61 to form the rear frame of the left framework 44, and a lower frame (fourth side) 64 that connects a lower end 62a of the front frame 62 and a lower end 63a of the rear frame 63 to form the lower frame of the left framework 44.

The left framework 44 is formed by the upper frame 61, the front frame 62, the rear frame 63, and the lower frame 64 into a rectangular frame shape on a side view.

The upper frame 61 is formed as a hollow member having an almost rectangular section. The front frame 62 is formed as a hollow member having an almost rectangular section, and extends downward from the one end (that is, the front end) 61a to intersect the upper frame 61. The rear frame 63 is formed as a hollow member having an almost rectangular section, and extends downward from the other end (that is, the rear end) 61b to intersect the upper frame 61.

The lower frame 64 is formed as a hollow member having an almost rectangular section and arranged to face the upper frame 61. The lower frame 64 has an axle shaft 66 provided in a rear portion 64a.

The axle shaft 66 extends toward the rear portion 64a of the lower frame 64 of the right framework 45. That is, the axle shafts 66 are individually provided in the rear portion 64a of the lower frame 64 on the left side and in the rear portion 64a of the lower frame 64 on the right side. Hence, an interval is ensured between the axle shaft 66 on the left side and the axle shaft 66 on the right side (see FIG. 4).

As shown in FIG. 4, the left wheel 37 is supported by the axle shaft 66 on the left side 1, and the right wheel 38 is supported by the axle shaft 66 on the right side.

Referring back to FIG. 6, the first support frame 51 extends from a front end 64b of the lower frame 64 on the left side toward the lower frame 64 of the right framework 45. The first support frame 51 is formed as a hollow member having an almost rectangular section. A first left mount hole 67 is formed in an upper portion 51a.

The second support frame 52 is provided behind the first support frame 51 of the lower frame 64, and extends toward the lower frame 64 of the right framework 45. The second support frame 52 is formed as a hollow member having an almost rectangular section. A second left mount hole 68 is formed in an upper portion 52a.

The third support frame 53 is provided behind the second support frame 52 of the lower frame 64, and extends toward the lower frame 64 of the right framework 45. The third support frame 53 is formed as a hollow member having an almost rectangular section. A third left mount hole 69 is formed in an upper portion 53a.

As shown in FIGS. 4 and 5, the front end 61a of the upper frame 61 of the left framework 44 and the front end 61a of the upper frame 61 of the right framework 45 are connected by the first upper connecting member 46. The first upper connecting member 46 includes a left side portion 46a mounted on the front end 61a of the upper frame 61 on the left side, a right side portion 46b mounted on the front end 61a of the upper frame 61 on the right side, and a connecting portion 46c that connects the left side portion 46a and the right side portion 46b.

The first upper connecting member 46 is formed into an almost U shape by the left side portion 46a, the right side portion 46b, and the connecting portion 46c. A first left bent portion 72 is formed into an almost L shape by the left side portion 46a and the connecting portion 46c. A first right bent portion 73 is formed into an almost L shape by the right side portion 46b and the connecting portion 46c.

The length of the connecting portion 46c is set to be smaller than the interval between the left framework 44 and the right framework 45.

The central portion 61c of the upper frame 61 of the left framework 44 and the central portion 61c of the upper frame 61 of the right framework 45 are connected by the second upper connecting member 47. The second upper connecting member 47 includes a left side portion 47a mounted on the central portion 61c of the upper frame 61 on the left side, a right side portion 47b mounted on the central portion 61c of the upper frame 61 on the right side, and a connecting portion 47c that connects the left side portion 47a and the right side portion 47b.

The second upper connecting member 47 is formed into an almost U shape by the left side portion 47a, the right side portion 47b, and the connecting portion 47c. A second left bent portion 74 is formed into an almost L shape by the left side portion 47a and the connecting portion 47c. A second right bent portion 75 is formed into an almost L shape by the right side portion 47b and the connecting portion 47c.

The length of the connecting portion 47c is set to be smaller than the interval between the left framework 44 and the right framework 45.

The rear end 61b of the upper frame 61 of the left framework 44 and the rear end 61b of the upper frame 61 of the right framework 45 are connected by the third upper connecting member 48. The third upper connecting member 48 includes a left side portion 48a mounted on the rear end 61b of the upper frame 61 on the left side, a right side portion 48b mounted on the rear end 61b of the upper frame 61 on the right side, and a connecting portion 48c that connects the left side portion 48a and the right side portion 48b.

The third upper connecting member 48 is formed into an almost U shape by the left side portion 48a, the right side portion 48b, and the connecting portion 48c. A third left bent portion 76 is formed into an almost L shape by the left side portion 48a and the connecting portion 48c. A third right bent portion 77 is formed into an almost L shape by the right side portion 48b and the connecting portion 48c.

The length of the connecting portion 48c is set to be smaller than the interval between the left framework 44 and the right framework 45.

As described above, the first upper connecting member 46 includes the first left bent portion 72 and the first right bent portion 73. The second upper connecting member 47 includes the second left bent portion 74 and the second right bent portion 75. The third upper connecting member 48 includes the third left bent portion 76 and the third right bent portion 77.

Hence, when the impact load F2 is input to the power conversion apparatus 20, the first upper connecting member 46 is bent by the input impact load F2 at the first left bent portion 72 and the first right bent portion 73. Additionally, the second upper connecting member 47 is bent by the input impact load F2 at the second left bent portion 74 and the second right bent portion 75. Furthermore, the third upper connecting member 48 is bent by the input impact load F2 at the third left bent portion 76 and the third right bent portion 77.

An interval is ensured between the first to third support frames 51 to 53 of the lower frame 64 of the left framework 44 and the first to third support frames 54 to 56 of the lower frame 64 of the right framework 45. The connecting panel 58 is placed on the first to third support frames 51 to 53 on the left side and the first to third support frames 54 to 56 on the right side.

A left end 58a of the connecting panel 58 is mounted on the lower frame 64 on the left side. A right end 58b of the connecting panel 58 is mounted on the lower frame 64 on the right side. That is, the lower frame 64 on the left side and the lower frame 64 on the right side are connected by the connecting panel 58.

In this state, the connecting panel 58 is arranged at a position to cover the lower side of the first to third power conversion units 24 to 26 (see FIG. 3 as well). Hence, the first to third power conversion units 24 to 26 are protected by the connecting panel 58.

As shown in FIGS. 3 and 4, the connecting panel 58 includes a bent portion 79 between the first to third support frames 51 to 53 on the left side and the first to third support frames 54 to 56 on the right side. The bent portion 79 is formed into an almost V shape projecting downward. The bent portion 79 extends in the front-and-rear direction, thereby having a first bent portion 79a, a second bent portion 79b, and a third bent portion 79c extending in the front-and-rear direction.

Hence, when the impact load F2 is input to the power conversion apparatus 20, the connecting panel 58 is bent by the input impact load F2 at the first bent portion 79a, the second bent portion 79b, and the third bent portion 79c.

In addition, the upper frame 61 of the left framework 44 and the upper frame 61 of the right framework 45 are connected by the first to third upper connecting members 46 to 48. The lower frame 64 of the left framework 44 and the lower frame 64 of the right framework 45 are connected by the connecting panel.

Hence, the housing 21 is formed into an almost rectangular frame body by the left framework 44, the right framework 45, the first to third upper connecting members 46 to 48, and the connecting panel 58.

As shown in FIGS. 4 and 5, a lower portion 62b of the front frame 62 of the left framework 44 and the lower portion 62b of the front frame 62 of the right framework 45 are connected by the front grip 34. In other words, the front grip 34 is provided on the front portion of the housing 21.

The front grip 34 includes a left grip side portion 34a mounted on the lower portion 62b of the front frame 62 on the left side, a right grip side portion 34b mounted on the lower portion 62b of the front frame 62 on the right side, and a front grip portion 34c that connects the left grip side portion 34a and the right grip side portion 34b.

The front grip 34 is formed into an almost U shape by the left grip side portion 34a, the right grip side portion 34b, and the front grip portion 34c. A front left bent portion 82 is formed into an almost L shape by the left grip side portion 34a and the front grip portion 34c. A front right bent portion 83 is formed into an almost L shape by the right grip side portion 34b and the front grip portion 34c.

The length of the front grip portion 34c is set to be smaller than the interval between the left framework 44 and the right framework 45.

The rear portion 64a of the lower frame 64 of the left framework 44 and the rear portion 64a of the lower frame 64 of the right framework 45 are connected by the rear grip 35. In other words, the rear grip 35 is provided on the rear portion of the housing 21.

The rear grip 35 includes a left grip side portion 35a mounted on the rear portion 64a of the lower frame 64 on the left side, a right grip side portion 35b mounted on the rear portion 64a of the lower frame 64 on the right side, and a rear grip portion 35c that connects the left grip side portion 35a and the right grip side portion 35b.

The rear grip 35 is formed into an almost U shape by the left grip side portion 35a, the right grip side portion 35b, and the rear grip portion 35c. A rear left bent portion 84 is formed into an almost L shape by the left grip side portion 35a and the rear grip portion 35c. A rear right bent portion 85 is formed into an almost L shape by the right grip side portion 35b and the rear grip portion 35c.

The length of the rear grip portion 35c is set to be smaller than the width of the power conversion apparatus 20 (see FIG. 2).

As described above, the front left bent portion 82 and the front right bent portion 83 are formed in the front grip 34. The rear left bent portion 84 and the rear right bent portion 85 are formed in the rear grip 35. Hence, when the impact load F2 is input to the power conversion apparatus 20, the front grip 34 is bent by the input impact load F2 at the front left bent portion 82 and the front right bent portion 83. Additionally, the rear grip 35 is bent at the rear left bent portion 84 and the rear right bent portion 85.

The front frame 62 of the left framework 44 and the front frame 62 of the right framework 45 are connected by the front grip 34. The rear frame 63 of the left framework 44 and the rear frame 63 of the right framework 45 are connected by the rear grip 35.

Hence, the left framework 44 and the right framework 45 are firmly connected by the front grip 34 and the rear grip 35.

Each of the first to third upper connecting members 46 to 48 is bent into an almost U shape. The connecting panel 58 is formed into an almost V shape and includes the first bent portion 79a, the second bent portion 79b, and the third bent portion 79c. Each of the front grip 34 and the rear grip 35 is formed into an almost U shape.

Hence, in a state in which the power conversion apparatus 20 is mounted in the vehicle 10 (see FIG. 1), if the impact load F2 is input to the power conversion apparatus 20 due to a collision or the like, the first to third upper connecting members 46 to 48, the connecting panel 58, the front grip 34, and the rear grip 35 can be deformed (plastically deformed) by the input impact load F2.

Figure 7:
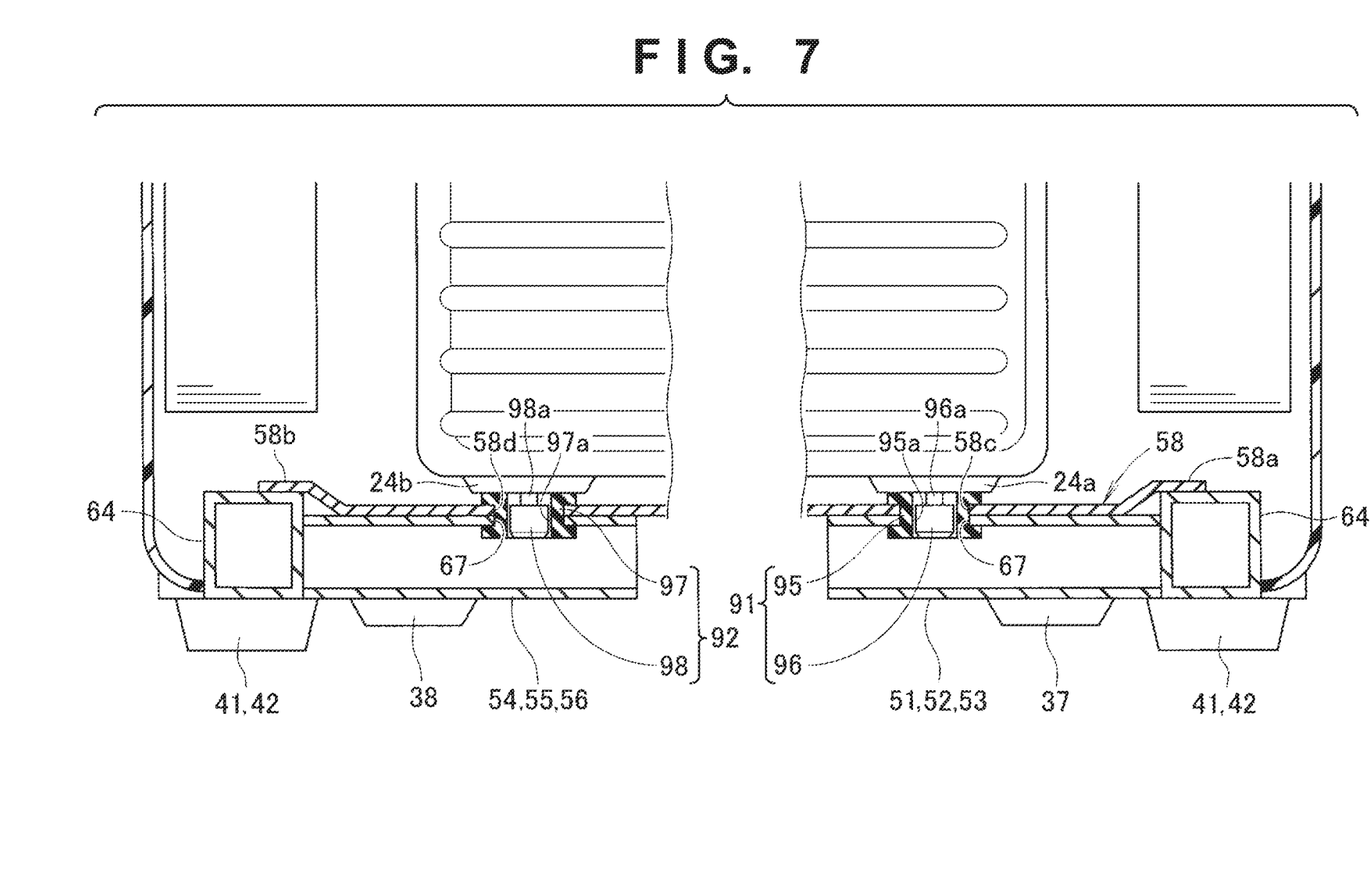
FIG. 7 is an enlarged view of a portion 7 in FIG. 3.

As shown in FIGS. 3 and 7, the first to third power conversion units 24 to 26 are mounted on the first to third support frames 51 to 53 of the left framework 44, the first to third support frames 54 to 56 of the right framework 45, and an upper panel 87 by the support portions 28.

The upper panel 87 intervenes between the upper frame 61 on the left side and the upper frame 61 on the right side. A left end 87a of the upper panel 87 is joined to the upper frame 61 on the left side. A right end 87b of the upper panel 87 is joined to the upper frame 61 on the right side.

A plurality of bent portions (not shown) are preferably formed on the upper panel 87, like the connecting panel 58. Hence, when the impact load F2 is input to the power conversion apparatus 20, the upper panel 87 is bent by the input impact load F2 at the plurality of bent portions.

Note that the first to third power conversion units 24 to 26 are supported by almost the same structure. Hence, an explanation will be made below by defining the support structure of the first power conversion unit 24 as the support portion 28, and a description of the support structures of the second and third power conversion units 25 and 26 will be omitted.

The support portion 28 includes a left lower support portion 91 that mounts a left lower portion 24a of the first power conversion unit 24 on the first support frame 51 on the left side, a right lower support portion 92 that mounts a right lower portion 24b of the first power conversion unit 24 on the first support frame 54 on the right side, and an upper support portion 93 that mounts an upper portion 24c of the first power conversion unit 24 on the upper panel 87.

The left lower support portion 91 includes a rubber mount 95 mounted on the first left mount hole 67 of the first support frame 51 on the left side and a first left mount hole 58c of the connecting panel 58, and a projecting portion 96 inserted into a through hole 95a of the rubber mount 95. The projecting portion 96 projects downward from the left lower portion 24a of the first power conversion unit 24, and includes a base 96a formed to have a small sectional area.

The right lower support portion 92 includes a rubber mount 97 mounted on the first right mount hole 67 of the first support frame 54 on the right side and a first right mount hole 58d of the connecting panel 58, and a projecting portion 98 inserted into a through hole 97a of the rubber mount 97. The projecting portion 98 projects downward from the right lower portion 24b of the first power conversion unit 24, and includes a base 98a formed to have a small sectional area.

The upper support portion 93 includes a rubber mount 101 mounted on an upper mount hole 87c of the upper panel 87, and a projecting portion 102 inserted into a through hole 101a of the rubber mount 101. The projecting portion 102 projects upward from the p upper portion 24c of the first power conversion unit 24, and includes a base 102a formed to have a small sectional area.

The first power conversion unit 24 is thus mounted on the first support frame 51 of the left framework 44, the first support frame 54 of the right framework 45, and the upper panel 87 by the support portion 28.

Note that the second and third power conversion units 25 and 26 are mounted, like the first power conversion unit 24.

In this state, a left space 105 is formed between the blowing fans 31 and the first to third power conversion units 24 to 26. In addition, a right space 106 is formed between the intake fans 32 and the first to third power conversion units 24 to 26.

In the left space 105 and the right space 106, the deformation of the first to third upper connecting members 46 to 48, the connecting panel 58, the front grip 34, and the rear grip 35 is ensured.

When the first to third power conversion units 24 to 26 are mounted, the first to third power conversion units 24 to 26 are included in the power conversion apparatus 20. It is therefore possible to convert DC power generated by the vehicle 10 into AC power by the first to third power conversion units 24 to 26 in the power conversion apparatus 20 and extract the converted AC power to the outside.

The base 96a of the projecting portion 96 of the left lower support portion 91 is formed to have a small sectional area, and the base 98a of the projecting portion 98 of the right lower support portion 92 is formed to have a small sectional area. In addition, the base 102a of the projecting portion 102 of the upper support portion 93 is formed to have a small sectional area.

It is therefore possible to break the bases 96a, 98a, and 102a of the projecting portions 96, 98, and 102 by the impact load F2 input to the power conversion apparatus 20.

Hence, the first support frame 51 on the left side or the first support frame 54 on the right side can be moved with respect to the first power conversion unit 24. That is, the first support frame 51 on the left side is mounted on the left lower portion 24a of the first power conversion unit 24 by the left lower support portion 91 to be movable by the impact load F2.

Similarly, the first support frame 54 on the right side is mounted on the right lower portion 24b of the first power conversion unit 24 by the right lower support portion 92 to be movable by the impact load F2.

Accordingly, the first to third upper connecting members 46 to 48, the connecting panel 58, the front grip 34, and the rear grip 35 can be deformed by the input impact load F2.

An example in which intrusion of the power conversion apparatus 20 to the side of the cabin 14 caused by an impact load F4 is suppressed will be described next with reference to FIGS. 8A and 8B.

Figure 8A:
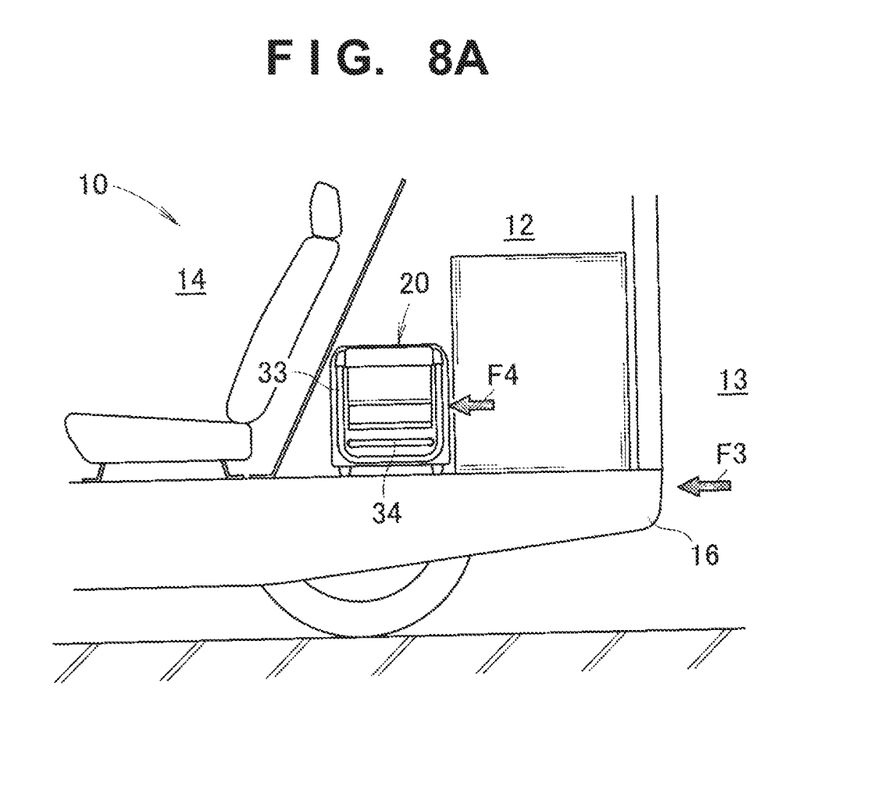
FIGS. 8A and 8B are views for explaining an example in which intrusion of the power conversion apparatus according to the present invention to the cabin side caused by an impact load is suppressed.

As shown in FIG. 8A, an impact load F3 is input to the rear portion 16 of the vehicle 10 due to a rear end collision or the like during traveling of the vehicle 10. When the impact load F3 is input to the rear portion 16 of the vehicle 10, the impact load F4 is input to the power conversion apparatus 20.

Figure 8B:
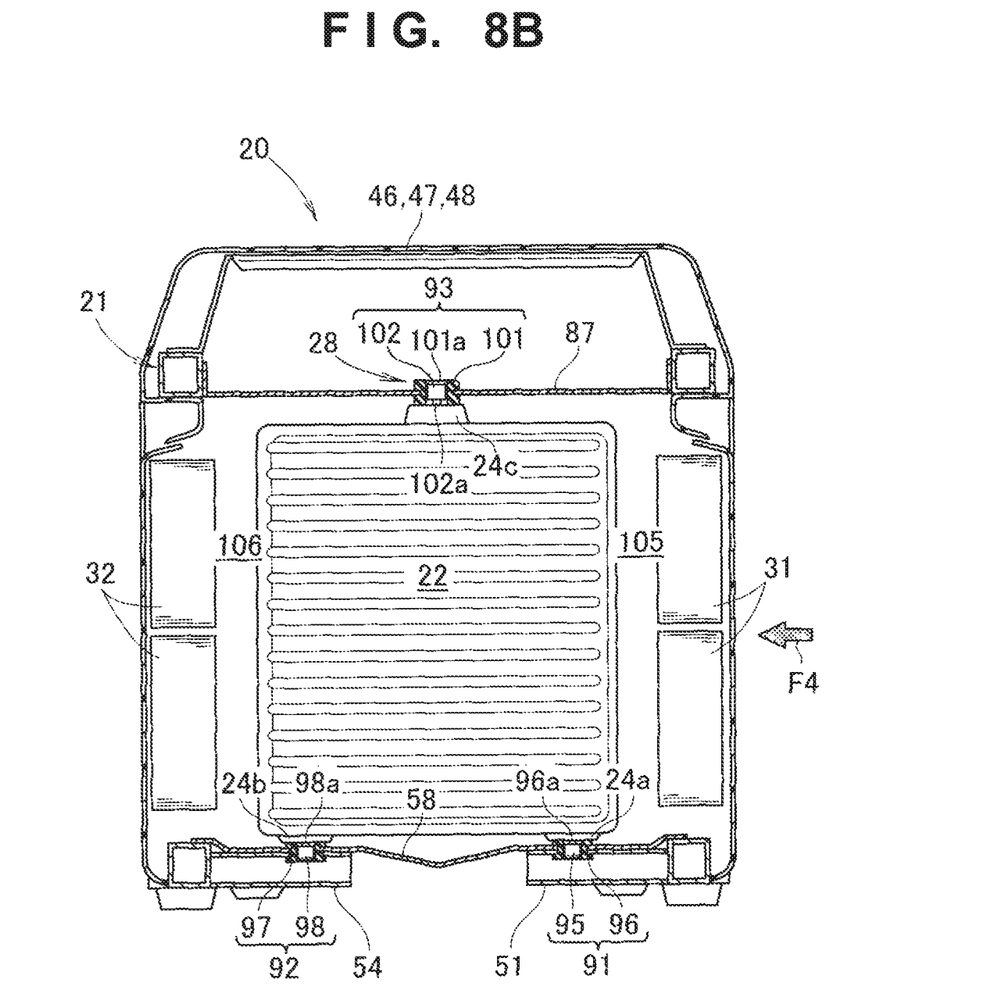

As shown in FIG. 8B, the impact load F4 acts on the projecting portion 96 of the left lower support portion 91, the projecting portion 98 of the right lower support portion 92, and the projecting portion 102 of the upper support portion 93. Hence, the base 96a of the projecting portion 96, the base 98a of the projecting portion 98, and the base 102a of the projecting portion 102 break due to the impact load F4 acting on the projecting portions 96, 98, and 102.

When the bases 96a, 98a, and 102a rupture, the first support frame 51 on the left side can be moved with respect to the left lower portion 24a of the first power conversion unit 24. Additionally, the first support frame 54 on the right side can be moved with respect to the right lower portion 24b of the first power conversion unit 24. Furthermore, the upper panel 87 can be moved with respect to the upper portion 24c of the first power conversion unit 24.

In addition, the left space 105 and the right space 106 are ensured in the power conversion apparatus 20.

Hence, the first to third upper connecting members 46 to 48, the connecting panel 58, the front grip 34 (see FIG. 4), and the rear grip 35 (see FIG. 4) can be deformed (plastically deformed) by the impact load F4 input to the power conversion apparatus 20.

Similarly, the upper panel 87 can be deformed (plastically deformed) by the impact load F4 input to the power conversion apparatus 20. In addition, the towing handle 33 can be deformed (plastically deformed) by the impact load F4 input to the power conversion apparatus 20.

An interval is ensured between the axle shaft 66 on the left side and the axle shaft 66 on the right side (see FIG. 4). Hence, when deforming the first to third upper connecting members 46 to 48, the connecting panel 58, the front grip 34, the rear grip 35, and the upper panel 87 by the input impact load F4, the axle shafts 66 on the left and right sides do not impede the deformation of the members 46 to 48, 58, 34, 35, and 87.

It is therefore possible to deform the power conversion apparatus 20 and suppress intrusion of the power conversion apparatus 20 to the side of the cabin 14 (see FIG. 8A).

In addition, when intrusion of the power conversion apparatus 20 to the side of the cabin 14 is suppressed using the housing 21, the front grip 34, and the rear grip 35 (see FIG. 4) which constitute the power conversion apparatus 20, any new member is unnecessary. It is therefore possible to simplify the structure of the power conversion apparatus 20 and suppress the weight of the power conversion apparatus 20.

This can reduce the burden particularly in a case in which the power conversion apparatus 20 is raised by the front grip 34 or the rear grip 35 and carried or mounted in the rear luggage room 12 (see FIG. 8A) of the vehicle 10. It is therefore possible to increase the usability of the power conversion apparatus 20 and extend the application purpose.

Note that the power conversion apparatus according to the present invention is not limited to the above-described embodiment, and can appropriately be changed and improved.

For example, in the embodiment, an external power feeding apparatus has been exemplified as the power conversion apparatus 20. However, the present invention is not limited to this, and can also be applied to any other external power feeding apparatus such as an electric generator.

In the embodiment, an example in which the base 96a of the projecting portion 96 of the left lower support portion 91, the base 98a of the projecting portion 98 of the right lower support portion 92, the base 102a of the projecting portion 102 of the upper support portion 93, and the like are broken has been described. However, the present invention is not limited to this.

For example, as another example, long holes can be formed in the first to third support frames 51 to 53 of the left framework 44 and the first to third support frames 54 to 56 of the right framework 45, and the projecting portions of the first to third power conversion units 24 to 26 can be inserted into the long holes.

When an impact load is input, the long holes are caused to slide along the projecting portions by the input impact load, thereby deforming the first to third upper connecting members 46 to 48, the connecting panel 58, the front grip 34, the rear grip 35, and the upper panel 87, as in the embodiment.

In the embodiment, the first to third upper connecting members 46 to 48 have been exemplified as the first connecting members. The number of upper connecting members can arbitrarily set to, for example, 2.

The shapes and structures of the vehicle, the power conversion apparatus, the housing, the first to third power conversion units, the support portion, the front and rear grips, the left and right wheels, the left and right frameworks, the first to third upper connecting members, the first to third support frames on the left side, the first to third support frames on the right side, the connecting panel, the upper frame, the front frame, the rear frame, the lower frame, the left and right axle shafts, and the like described in the above embodiment are not limited to those exemplified, and can appropriately be changed.

According to an aspect of the present invention, there is provided an external power feeding apparatus configured to be portable and mountable in a vehicle, incorporating a power supply unit, and capable of supplying power from the power supply unit to the outside, comprising a pair of frameworks arranged on both sides of the power supply unit to face each other at a predetermined interval and formed into a substantially rectangular frame shape, a first connecting member configured to connect first sides of the pair of frameworks and formed into a substantial U shape, a second connecting member configured to connect second sides of the pair of frameworks, which are provided to intersect one end sides of the first sides and formed into a substantial U shape, and a third connecting member configured to connect third sides of the pair of frameworks, which are provided to intersect other end sides of the first sides and formed into a substantial U shape.

The first sides of the pair of frameworks are connected by the first connecting member, and the first connecting member is formed into an almost U shape. The second sides of the pair of frameworks are connected by the second connecting member, and the second connecting member is formed into an almost U shape. The third sides of the pair of frameworks are connected by the third connecting member, and the third connecting member is formed into an almost U shape.

Hence, the pair of frameworks can be connected by the first connecting member, the second connecting member, and the third connecting member. This makes it possible to support the power supply unit by the pair of frameworks and the first to third connecting members.

On the other hand, each of the first to third connecting members is bent into an almost U shape. That is, bent portions having an almost L shape are formed on both sides of each of the first to third connecting members. Hence, in a state in which the external power feeding apparatus is mounted in the vehicle, if an impact load is input to the external power feeding apparatus due to a collision or the like, the bent portions of the first to third connecting members can be deformed (plastically deformed) by the input impact load.

As described above, by deforming the bent portions of the first to third connecting members, intrusion of the external power feeding apparatus to the cabin side can be suppressed.

In addition, when intrusion of the external power feeding apparatus to the cabin side is suppressed using the first to third connecting members that constitute the external power feeding apparatus, any new member is unnecessary. It is therefore possible to simplify the structure and suppress the weight. This can reduce the burden particularly in a case in which the external power feeding apparatus is raised and carried or mounted in the vehicle and increase the usability of the external power feeding apparatus.

According to another aspect of the present invention, the external power feeding apparatus further comprises a pair of axle shafts individually provided on the pair of frameworks, and a pair of wheels for movement individually supported by the pair of axle shafts.

As described above, the pair of axle shafts are individually provided on the pair of frameworks. That is, an interval can be ensured between the pair of axle shafts. Hence, when deforming (plastically deforming) the bent portions of the first to third connecting members by the input impact load, the axle shafts do not impede the deformation of the bent portions. This makes it possible to satisfactorily deform the bent portions of the first to third connecting members.

According to still another aspect of the present invention, the external power feeding apparatus further comprises fourth sides configured to connect the second sides and the third sides of the pair of frameworks and face the first sides, and a connecting panel configured to connect the fourth sides and including a bent portion between the fourth sides.

As described above, the fourth sides of the pair of frameworks are connected by the connecting panel. This allows the power supply unit to be protected by the connecting panel. In addition, of the connecting panel, the bent portion is formed between the fourth sides. Hence, when deforming (plastically deforming) the bent portions of the first to third connecting members by the input impact load, the connecting panel can be deformed at the bent portion. This makes it possible to suppress intrusion of the external power feeding apparatus to the cabin side.

According to yet another aspect of the present invention, the external power feeding apparatus further comprises one support frame extending from one of the fourth sides toward the other, the other support frame extending from the other of the fourth sides toward the one, and a support portion configured to mount the other support frame and the one support frame on the power supply unit to be movable by an impact load.

As described above, the other support frame and the one support frame are movably mounted on the power supply unit. Hence, when deforming (plastically deforming) the bent portions of the first to third connecting members by the input impact load, the support frames can be moved with respect to the power supply unit. This makes it possible to satisfactorily deform (plastically deform) the bent portions of the first to third connecting members.

The present invention can suitably be applied to an external power feeding apparatus configured to be portable and mountable in a vehicle, incorporating a power supply unit, and capable of supplying power from the power supply unit to the outside.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefits of Japanese Patent Application No. 2016-024653, filed Feb. 12, 2016, which is hereby incorporated by reference herein in its entirety.

What is claimed is:

1. An external power feeding apparatus configured to be portable and mountable in a vehicle, incorporating a power supply unit, and capable of supplying power from the power supply unit to outside, comprising:
a pair of frameworks arranged on both sides of the power supply unit to face each other at a predetermined interval and formed into a substantially rectangular frame shape;
a first connecting member configured to connect first sides of the pair of frameworks and formed into a substantial U shape;
a second connecting member configured to connect second sides of the pair of frameworks, which are provided to intersect one end sides of the first sides and formed into a substantial U shape;
a third connecting member configured to connect third sides of the pair of frameworks, which are provided to intersect other end sides of the first sides and formed into a substantial U shape;
a pair of axle shafts individually provided on the pair of frameworks; and
a pair of wheels for movement individually supported by the pair of axle shafts.

2. An external power feeding apparatus configured to be portable and mountable in a vehicle, incorporating a power supply unit, and capable of supplying power from the power supply unit to outside, comprising:
a pair of frameworks arranged on both sides of the power supply unit to face each other at a predetermined interval and formed into a substantially rectangular frame shape;
a first connecting member configured to connect first sides of the pair of frameworks and formed into a substantial U shape;
a second connecting member configured to connect second sides of the pair of frameworks, which are provided to intersect one end sides of the first sides and formed into a substantial U shape;
a third connecting member configured to connect third sides of the pair of frameworks, which are provided to intersect other end sides of the first sides and formed into a substantial U shape;
fourth sides configured to connect the second sides and the third sides of the pair of frameworks and face the first sides; and
a connecting panel configured to connect the fourth sides and including a bent portion between the fourth sides.

3. The apparatus according to claim 2, further comprising:
one support frame extending from one of the fourth sides toward another of the fourth sides;
another support frame extending from the another of the fourth sides toward the one of the fourth sides; and
a support portion configured to mount the another support frame and the one support frame on the power supply unit to be movable by an impact load.

* * * * *